United States Patent [19]
Dolman

[11] Patent Number: 6,009,312
[45] Date of Patent: Dec. 28, 1999

[54] TRANSMIT SIGNAL GENERATION WITH THE AID OF A RECEIVER

[75] Inventor: Rodney Allen Dolman, Cary, N.C.

[73] Assignee: Ericsson Inc., Research Triangle Park, N.C.

[21] Appl. No.: 08/795,930

[22] Filed: Feb. 5, 1997

[51] Int. Cl.⁶ .................................................... H04B 1/40
[52] U.S. Cl. .............................. 455/76; 455/260; 331/16
[58] Field of Search ................................. 455/75, 76, 83, 455/112, 113, 115, 118, 119, 182.1, 182.2, 183.1, 192.2, 266, 255, 257, 258, 259, 265, 260; 331/16

[56] References Cited

U.S. PATENT DOCUMENTS

| | | | |
|---|---|---|---|
| 4,027,242 | 5/1977 | Yamanaka . | |
| 4,246,539 | 1/1981 | Haruki et al. . | |
| 4,932,072 | 6/1990 | Toko | 455/76 |
| 5,152,005 | 9/1992 | Bickley | 455/76 |
| 5,493,710 | 2/1996 | Takahara et al. | 455/75 |
| 5,594,735 | 1/1997 | Jokura | 455/76 |
| 5,610,558 | 3/1997 | Mittel et al. | 455/76 |
| 5,890,051 | 3/1999 | Schlang et al. | 455/76 |

FOREIGN PATENT DOCUMENTS

| | | |
|---|---|---|
| 0581573 | 2/1994 | European Pat. Off. . |
| 0678 974 | 10/1995 | European Pat. Off. . |
| 2279519 | 1/1995 | United Kingdom . |

OTHER PUBLICATIONS

"UHF Technology for the Cordless Revolution", Electronics World and Wireless World, vol. 99, No. 1688, Jul. 1, 1993, pp. 542–546.

*Primary Examiner*—Nguyen Vo
*Assistant Examiner*—Sam Bhattacharya
*Attorney, Agent, or Firm*—Burns, Doane, Swecker & Mathis, L.L.P.

[57] ABSTRACT

A transceiver which generates transmit and receive channel frequencies using a single crystal reference oscillator is disclosed. A first and second local oscillator is connected to the crystal reference oscillator. A first down converter is connected to the first local oscillator which mixes a receive signal with a first local oscillator frequency to produce a first intermediate frequency signal. The first intermediate frequency signal is then amplified and filtered and applied to a second down convertor which mixes the filtered first intermediate frequency signal with a second local oscillator frequency to produce a second intermediate frequency. A transmit frequency offset is then generated using the second local oscillator frequency. A transmit frequency generator generates a transmit frequency using the transmit frequency offset and the first local oscillator frequency.

10 Claims, 2 Drawing Sheets

TRANSMIT SIGNAL GENERATION WITH THE AID OF A RECEIVER

FIELD OF THE INVENTION

The present invention relates to portable radio transmitters/receivers such as hose used in cellular phones, and more particularly to a method and apparatus for generating transmit and receive channel frequencies in a transceiver which contains a double superheterodyne receiver using a common reference frequency.

BACKGROUND OF THE INVENTION

Double superheterodyne receivers, which are also known as double conversion receivers or triple detector receivers, are commonly used in, for example, UHF and RF communications. Such receivers provide high gain without instability, good suppression of the image frequencies, and high adjacent channel selectivity.

In these receivers, an incoming RF carrier frequency is mixed with a first local oscillator signal to produce a first IF signal. The first IF signal is then mixed with a second local oscillator signal to provide a second, or final IF signal, and such a signal is provided to a detector to detect the information carried on the second IF carrier.

In the transmitter/receiver used in cellular phones these days, the first locally generated oscillator frequency is also used to help generate the transmit frequency. The transmit frequency is generated by a transmitted frequency generator using the first locally generated oscillator frequency and a transmit offset frequency. The transmit offset frequency is produced by a transmit offset loop. Previous systems were DAMPS systems which used a phase detector reference of 19.44 MHz at the phase detector. In these DAMPS systems, a Gilbert cell mixer is used as a phase detector, which is an analog-type mixer. Other systems use frequency phase type detectors as phase detectors. In order to meet cellular standards, the system must be able to come up and be on frequency and transmitting within a predetermined period of time after the system is turned on. In addition, in order to conserve current in the radio, the intermediate frequency of the transmit offset loop must come up within 100 microseconds of being turned on. In order to fulfill these criteria, the phase detector frequency in the transmit offset loop must be very high. In previous DAMPS systems, the reference frequency was injected into the transmit offset loop and allowed the system to meet the lock time criteria set forth in the cellular standards.

However, problems occur in new dual-band communication systems which can be switched between different frequency bands. For example, a system may be capable of operating in the 800 MHz range for Damps systems and in the 1900 MHz range for PCS systems. In PCS systems, the frequency 19.44 MHz is a very important frequency for the correct operation of the digital signal processors within the system. Thus, the 19.44 MHz reference frequency must be maintained. However, when dual-band systems switch between different frequency bands, the 19.44 MHz frequency does not allow the system to generate a transmit offset phase detector reference frequency that is high enough to allow the system a sufficient lock time. To overcome this problem, some systems provide for fractional-N division but this adds great complexity and thus cost to the system.

Thus, there is a need for a method and apparatus for generating transmit and receive channel frequencies using a common reference crystal frequency wherein the system has a sufficiently high phase detector frequency in the transmit offset loop so as to meet the criteria set forth in the cellular standard.

SUMMARY OF THE INVENTION

It is an object of the present invention to provide a method and apparatus for generating transmit and receive channel frequencies using a common reference frequency crystal using a double superheterodyne receiver with a first local oscillator frequency synthesizer and a second local oscillator frequency synthesizer wherein the output of the second local oscillator frequency synthesizer is injected into the transmit offset loop so as to provide a high phase detector frequency within the loop.

According to one embodiment of the present invention, a transceiver which generates transmit and receive channel frequencies using a single crystal reference oscillator is disclosed. A first and second local oscillator is connected to the crystal reference oscillator. A first down converter is connected to the first local oscillator which mixes a receive signal with a first local oscillator frequency to produce a first intermediate frequency signal. The first intermediate frequency signal is then amplified and filtered and applied to a second down convertor which mixes the filtered first intermediate frequency signal with a second local oscillator frequency to produce a second intermediate frequency. Means are also provided for generating a transmit frequency offset using the second local oscillator frequency. A transmit frequency generator generates a transmit frequency using the transmit frequency offset and the first local oscillator frequency.

According to another embodiment of the present invention, a method for generating a transmit frequency in a double superheterodyne receiver with a single reference frequency oscillator is disclosed. First, a reference frequency is generated. The reference frequency is then applied to a first local oscillator and a second local oscillator which produce a first local oscillator frequency and a second local oscillator frequency, respectively. A transmit offset frequency is then generated by applying the second local oscillator frequency to a transmit offset loop. The transmit frequency is then generated by applying the first local oscillator frequency and the transmit offset frequency to a transmit frequency generator.

BRIEF DESCRIPTION OF THE DRAWINGS

These and other features and advantages of the invention will be readily apparent to one of ordinary skill in the art from the following written description, used in conjunction with the drawings, in which.

DETAILED DESCRIPTION OF THE PREFERRED EMBODIMENTS

Figure 1:
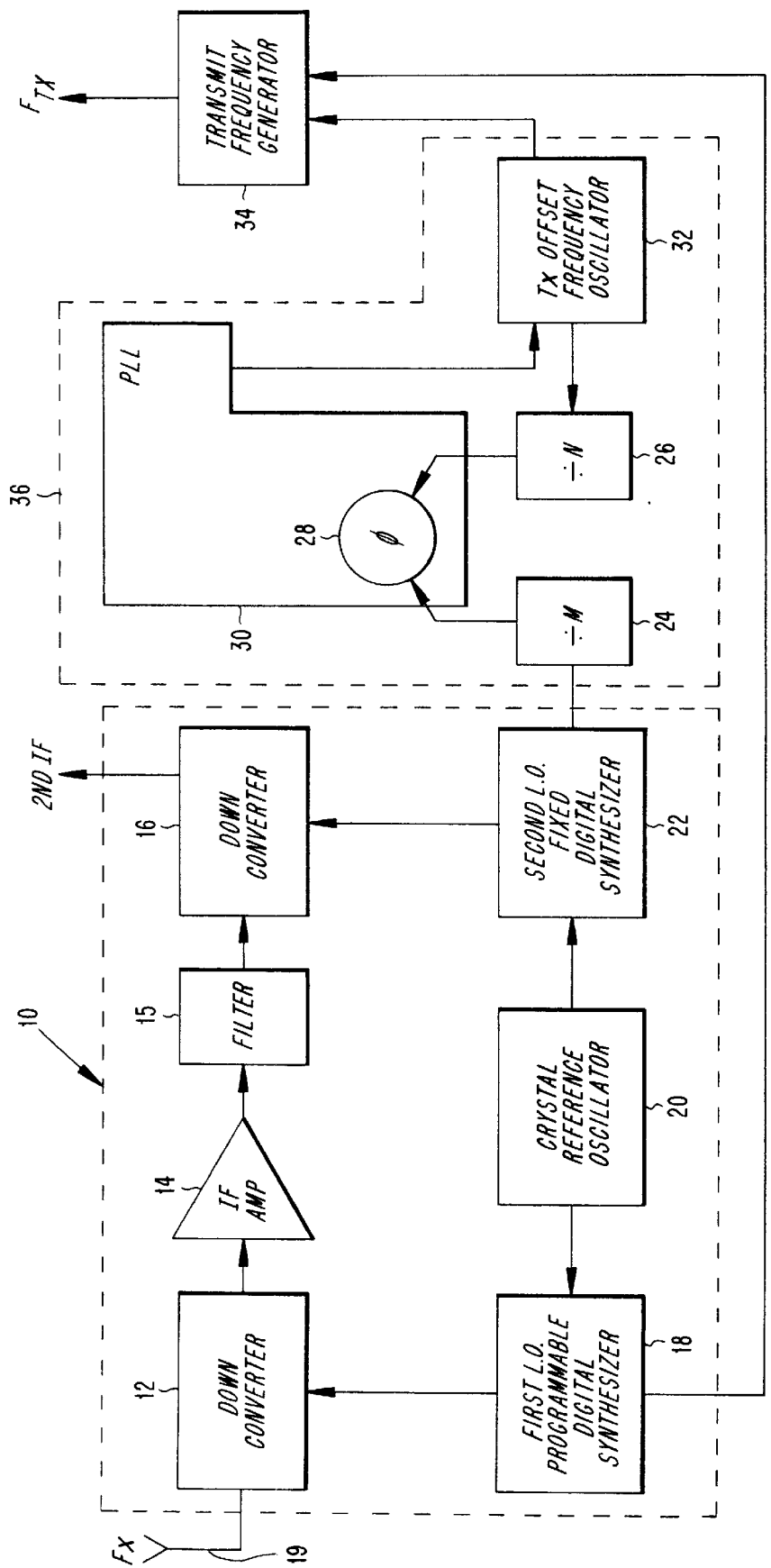
FIG. 1 illustrates a double superheterodyne receiver according to one embodiment of the present invention.

With reference to the drawings, and initially to FIG. 1 thereof, a double superheterodyne receiver embodying the present invention is illustrated in which a first and second local oscillating frequency is generated from a single reference oscillator and both of the local oscillator frequencies are used for reception of signals and also for generating a transmit frequency. While the present invention can be used in dual-band communication systems, the invention is not limited thereto.

As illustrated in FIG. 1, the double superheterodyne receiver 10 contains a reference oscillator such as a crystal oscillator 20 which produces a reference signal. For communications systems such as PCS and DAMPS, the reference frequency is usually 19.44 MHz, however, the present invention is not limited thereto. The reference frequency is applied to a first local oscillator programmable digital synthesizer 18 which is used to produce a first local oscillator frequency. Since the synthesizer 18 is programmable, the first local oscillator frequency can be adjusted depending on the demands on the system. A signal is received on the antenna 19 which applies the received signal to a first down convertor 12. The first down convertor 12 mixes the incoming carrier frequency of the received signal with the first local oscillator frequency so as to produce a first intermediate frequency (IF) signal. The first IF signal is then amplified in an amplifier 14 and filtered in a filter 15 and applied to a second down convertor 16. The reference signal is also applied to a second local oscillator fixed digital synthesizer 22 which produces a second local oscillator frequency. The second down convertor 16 mixes the amplified and filtered first IF signal with the second local oscillator frequency signal to produce a second IF signal which is then provided to a detector (not illustrated) to detect the information carried on the second IF signal.

According to the present invention, the first and second local oscillator frequencies can also be used to help generate the transmit frequency for the transmitter section of the transceiver. A transmit frequency generator 34 takes a signal and mixes it with the first local oscillator frequency produced by the synthesizer 18 and a transmit offset frequency produced by a transmit offset frequency oscillator 32 to produce the transmit signal. The transmit offset frequency is controlled by the transmit offset loop 36. The transmit offset loop 36 contains two dividers 24 and 26, and a phase-locked loop controller 30 which contains among other devices a phase detector 28. In addition, the transmit offset loop contains the transmit offset frequency oscillator 32. As noted above, in order for the system to operate within the cellular standards, the phase detector of the phase-locked loop must have a high phase detector frequency. However, in order to have a high frequency, the signal being inputted into the transmit offset loop, i.e., the second local oscillator signal, and the signal produced by the transmit offset frequency oscillator must both be dividable by integers to the same frequency value. As noted above, the 19.44 MHz signal produced by the reference oscillator is not divisible by convenient numbers. Thus, the present invention proposes injecting a second local oscillator frequency into the transmit offset loop rather than the reference frequency. Since the second local oscillator frequency is synthesized from the reference signal, the second local oscillator frequency has the same frequency stability as the original reference frequency.

In this embodiment of the present invention, the second local oscillator frequency has a frequency of 71.04 MHz. The second local oscillator frequency is applied to the first divider 24 while the output of the transmit offset frequency oscillator is applied to the second divider 26. The first divider 24 has a divisor M and the second divider 26 has a divisor N. After the transmitter is turned on, the signals outputted by the divisors 24 and 26 will quickly become approximately the same and will be the phase detector reference frequency. The transmit offset frequency oscillator is locked with the aid of the phase-locked loop circuit such that it bears an integer relationship given by M/N to the second local oscillator frequency. The advantage over the prior art method of locking the offset frequency to the crystal reference frequency by means of a phase-locked loop is that small integers M and N can be used to provide the desired offset frequency thereby improving phase noise during operation and reducing pull-in time from power on. For example, if the second local oscillator frequency is 71.04 MHz and the transmit offset frequency is 151.68 MHz, the divisor M can be set equal to 37 and the divisor N can be set equal to 79 so that both divisors 24 and 26 produce a signal with a frequency of 1.92 MHz. It will be understood that a plurality of phase detector reference frequencies can be produced depending upon what is used for the input.

Figure 2:
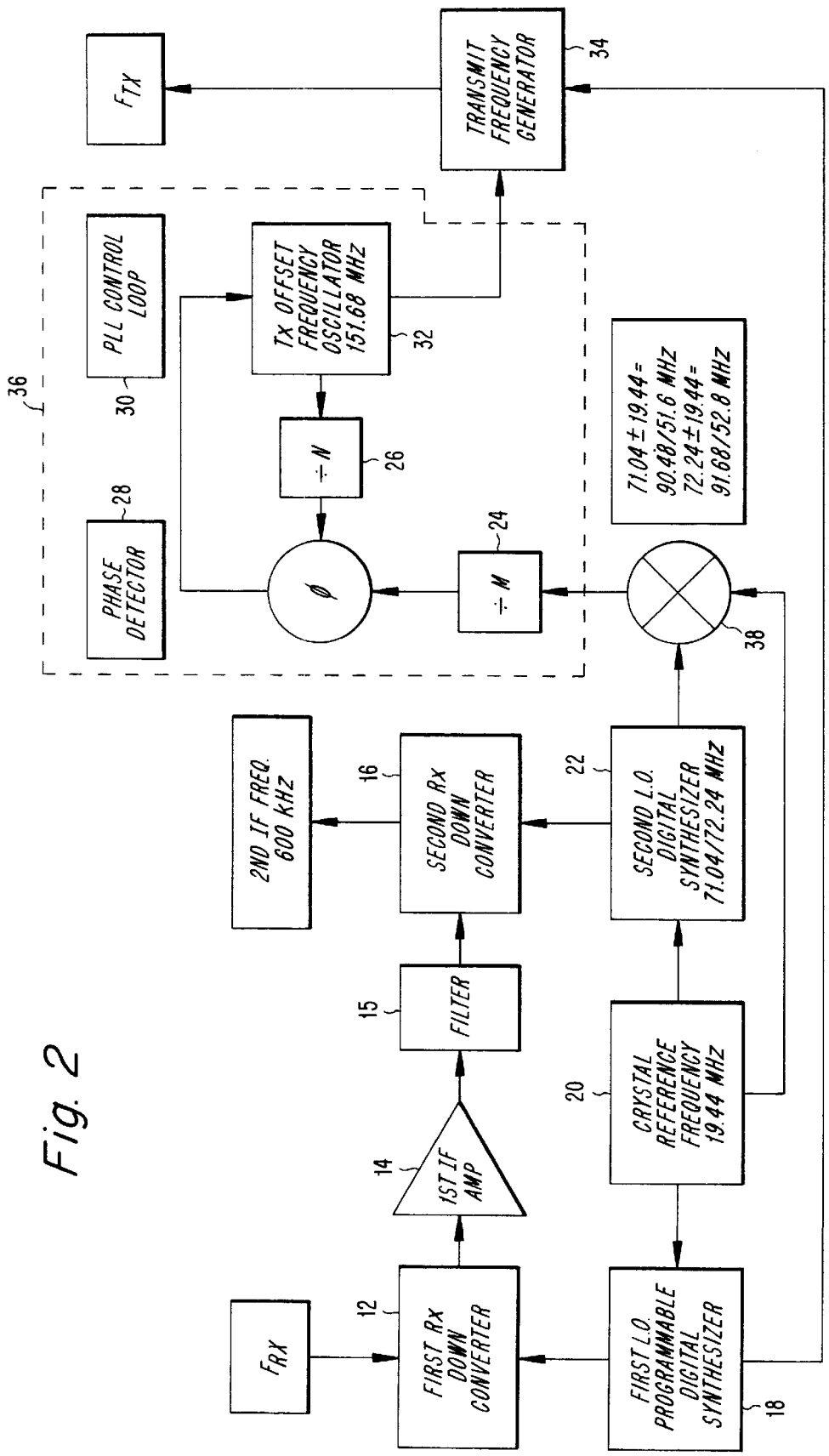
FIG. 2 illustrates a block diagram of a double superheterodyne receiver according to another embodiment of the present invention.

According to another embodiment of the present invention, at least one mixer can be inserted in between the second local oscillating synthesizer 22 and the first divider 24 so as to mix the second local oscillator frequency signal with other frequency signals so as to produce a variety of signals to choose from for injecting into the transmit offset loop. For example, as illustrated in FIG. 2, the mixer 38 can mix the second local oscillator's frequency signal with the reference frequency produced by the crystal reference oscillator 20 to generate another pair of frequencies than can be applied to the transmit offset loop 36. A control means (not illustrated) can be used to select which frequency should be generated for injection into the transmit offset loop. Furthermore, the control means can also change the values of the divisors M and N. Furthermore, it will be understood that any number of mixers can be inserted in a row wherein the output of the previous mixer is mixed in the next mixer with the reference frequency to produce even more frequencies that can be used in the transmit offset loop.

It will be appreciated by those of ordinary skill in the art that the present invention can be embodied in other specific forms without departing from the spirit or essential character thereof. The presently disclosed embodiments are, therefore, considered in all respects, to be illustrative and not restrictive. The scope of the invention is indicated by the appended claims rather than the foregoing description, and all changes that come within the mean and range of equivalence thereof are intended to be embraced therein.

What is claimed is:

1. A transceiver including a double superheterodyne receiver for generating transmit and receive channel frequencies using a single reference frequency oscillator, comprising:

a first and second local oscillator each connected to said reference oscillator;

a first down convertor connected to said first local oscillator for mixing a received signal with a first local oscillator frequency produced by said first local oscillator to produce a first intermediate frequency signal;

means for amplifying and filtering said first intermediate frequency signal;

a second down convertor connected to said second local oscillator for mixing said filtered first intermediate frequency signal with a second local oscillator frequency produced by said second local oscillator to produce a second intermediate frequency;

a transmit frequency offset oscillator using said second local oscillator frequency;

a phase-locked loop means for locking said transmit frequency offset oscillator to a frequency which has an integer relationship to the second local oscillator frequency; and a transmit frequency generator for generating a transmit frequency using said transmit frequency offset and said first local oscillator frequency.

2. A transceiver including a double superheterodyne receiver for generating transmit and receive channel frequencies using a single reference frequency oscillator, comprising:

a first and second local oscillator each connected to said reference oscillator;

a first down convertor connected to said first local oscillator for mixing a receive signal with a first local oscillator frequency produced by said first local oscillator to produce a first intermediate frequency signal;

means for amplifying and filtering said first intermediate frequency signal;

a second down convertor connected to said second local oscillator for mixing said filtered first intermediate frequency signal with a second local oscillator frequency produced by said second local oscillator to produce a second intermediate frequency;

means for generating a transmit frequency offset using said second local oscillator frequency; and a transmit frequency generator for generating a transmit frequency using said transmit frequency offset and said first local oscillator frequency, wherein said means for generating the transmit frequency offset, comprises:

a first divider for dividing said second local oscillator frequency by a first integer M;

a second divider for dividing an output of a transmit offset frequency oscillator by a second integer N;

means for combining outputs of said first and second dividers;

phase detector means for detecting the phase of the combined outputs;

phase-locked loop means connected between the phase detector and the transmit offset frequency oscillator for locking said transmit offset frequency oscillator to a frequency which bears an integer relationship given by M/N to the second local oscillator frequency.

3. A transceiver according to claim 2, wherein the first integer M is equal to 37 and the second integer N is equals to 79.

4. A transceiver according to claim 2, further comprising:

at least a first mixer located between said second local oscillator and said first divider for mixing the second local oscillator frequency with said reference frequency to produce an output frequency which is then applied to the first divider.

5. A method for generating a transmit frequency in a transceiver containing a double superheterodyne receiver with a single reference frequency oscillator, comprising the steps of:

generating a reference frequency;

generating a first local oscillator frequency from said reference frequency;

generating a second local oscillator frequency from said reference frequency;

generating a transmit frequency offset by applying said second local oscillator frequency to a transmit offset loop;

locking said transmit frequency offset oscillator to a frequency which has an integer relationship to the second local oscillator frequency; and generating a transmit frequency by applying said first local oscillator frequency and said transmit frequency offset to a transmit frequency generator.

6. A method for generating a transmit frequency in a transceiver containing a double superheterodyne receiver with a single reference frequency oscillator, comprising the steps of:

generating a reference frequency;

generating a first local oscillator frequency from said reference frequency;

generating a second local oscillator frequency from said reference frequency;

generating a transmit frequency offset applying said second local oscillator frequency to a transmit offset loop; and generating a transmit frequency by applying said first local oscillator frequency and said transmit frequency offset to a transmit frequency generator, wherein said step of generating a transmit offset frequency, comprises the steps of:

dividing said second local oscillator frequency by a first integer M;

dividing an output of a transmit frequency offset oscillator by a second integer N;

combining outputs of said first and second dividers and detecting the phase of said combined outputs; and locking said transmit frequency offset oscillator to a frequency which bears an integer relationship given by M|N to the second local oscillator frequency using a phase-locked loop.

7. A apparatus for generating a transmit frequency in a transceiver containing a double superheterodyne receiver with a single reference frequency oscillator, comprising:

means for generating a reference frequency;

means for generating a first local oscillator frequency from said reference frequency;

means for generating a second local oscillator frequency from said reference frequency;

a transmit frequency offset oscillator for applying said second local oscillator frequency to a transmit offset loop that generates a transmit frequency offset;

a phase-locked loop means for locking said transmit frequency offset oscillator to a frequency which has an integer relationship to the second local oscillator frequency; and a transmit frequency generator means for generating a transmit frequency by applying said first local oscillator frequency and said transmit frequency offset to the transmit frequency generator.

8. A apparatus for generating a transmit frequency in a transceiver containing a double superheterodyne receiver with a single reference frequency oscillator, comprising:

means for generating a reference frequency;

means for generating a first local oscillator frequency from said reference frequency;

means for generating a second local oscillator frequency from said reference frequency;

a transmit frequency offset oscillator for applying said second local oscillator frequency to a transmit offset loop that generates a transmit frequency offset, and a transmit frequency generator means for generating a transmit frequency by applying said first local oscillator frequency and said transmit frequency offset to the transmit frequency generator, wherein said means for generating the transmit frequency offset, comprises:

a first divider for dividing said second local oscillator frequency by a first integer M;

a second divider for dividing an output of a transmit offset frequency oscillator by a second integer N;

means for combining outputs of said first and second dividers;

phase detector means for detecting the phase of the combined outputs;

phase-locked loop means connected between the phase detector and the transmit frequency offset oscillator for locking said transmit frequency offset oscillator to a frequency which bears an integer relationship given by M/N to the second local oscillator frequency.

9. An apparatus according to claim 8, wherein the first integer M is equal to 37 and the second integer N is equals to 79.

10. An apparatus according to claim 8, further comprising:

at least a first mixer located between said means for generating the second local oscillator frequency and said first divider for mixing the second local oscillator frequency with said reference frequency to produce an output frequency which is then applied to the first divider.

\* \* \* \* \*